(12) United States Patent
Robinson et al.

(10) Patent No.: US 9,443,691 B2
(45) Date of Patent: Sep. 13, 2016

(54) ELECTRON EMISSION SURFACE FOR X-RAY GENERATION

(71) Applicant: General Electric Company, Schenectady, NY (US)

(72) Inventors: Vance Scott Robinson, Schenectady, NY (US); Carey Shawn Rogers, Brookfield, WI (US); Sergio Lemaitre, Whitefish Bay, WI (US); Mark Alan Frontera, Ballston Lake, NY (US); Sergiy Zalyubovskiy, Niskayuna, NY (US); Xi Zhang, Ballston Lake, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 130 days.

(21) Appl. No.: 14/144,187

(22) Filed: Dec. 30, 2013

(65) Prior Publication Data

US 2015/0187534 A1  Jul. 2, 2015

(51) Int. Cl.
*H01J 35/06* (2006.01)
*H01J 29/48* (2006.01)
*H01J 29/04* (2006.01)
*H01L 23/367* (2006.01)
(Continued)

(52) U.S. Cl.
CPC .............. *H01J 29/484* (2013.01); *H01J 3/26* (2013.01); *H01J 29/006* (2013.01); *H01J 29/04* (2013.01); *H01J 29/485* (2013.01); *H01J 35/06* (2013.01); *H01L 23/367* (2013.01); *H01L 23/373* (2013.01); *H01J 1/14* (2013.01); *H01J 1/15* (2013.01); *H01L 23/3178* (2013.01);
(Continued)

(58) Field of Classification Search
CPC .............. H01J 3/00; H01J 3/02; H01J 3/024; H01J 3/026; H01J 3/027; H01J 9/00; H01J 9/04; H01J 9/042; H01J 9/045; H01J 19/00; H01J 19/02; H01J 19/04; H01J 19/06; H01J 19/066; H01J 19/068; H01J 19/14; H01J 29/00; H01J 29/006; H01J 29/02; H01J 29/04; H01J 29/46; H01J 29/48; H01J 29/484; H01J 29/485; H01J 33/00; H01J 33/02; H01J 35/00; H01J 35/02; H01J 35/04; H01J 35/06; H01J 35/14; B82Y 30/00; B82Y 40/00; B82Y 99/00; H01L 33/00; H01L 33/02; H01L 33/20; H01L 33/26; H01L 33/36; H01L 33/38; H01L 33/44; H01L 33/64; H01L 33/641; H01L 33/642; H01L 23/00; H01L 23/28; H01L 23/29; H01L 23/291; H01L 23/298; H01L 23/31; H01L 23/3107; H01L 23/3135; H01L 23/3157; H01L 23/3171; H01L 23/3178; H01L 23/34; H01L 23/36; H01L 23/367; H01L 23/373; H01L 23/3731; H01L 23/3736; H01L 23/3738
USPC .............. 378/119, 121, 136–138, 210; 250/396 R, 493.1, 503.1, 526; 257/9–13, 79, 109, 163, 177, 178, 613, 257/618, 622, 623, 629; 438/20
See application file for complete search history.

(56) References Cited

U.S. PATENT DOCUMENTS

| | | |
|---|---|---|
| 3,290,543 A | 12/1966 | Weissman |
| 3,846,006 A | 11/1974 | Atlee et al. |

(Continued)

*Primary Examiner* — Anastasia Midkiff
(74) *Attorney, Agent, or Firm* — Fletcher Yoder, P.C.

(57) ABSTRACT

Embodiments of the disclosure relate to electron emitters for use in conjunction with X-ray emitting devices. In certain embodiments the emitter includes features that prevent, limit, or control deflection of the electron emitter at operating temperatures. In this manner, the electron emitter may be kept substantially flat or at a desired curvature during operation.

20 Claims, 11 Drawing Sheets

(51) Int. Cl.
    *H01L 23/373*     (2006.01)
    *H01J 3/26*     (2006.01)
    *H01J 29/00*     (2006.01)
    *H01L 33/44*     (2010.01)
    *H01L 33/64*     (2010.01)
    *H01L 23/31*     (2006.01)
    *H01J 1/14*     (2006.01)
    *H01J 1/15*     (2006.01)

(52) U.S. Cl.
    CPC ........ *H01L23/3736* (2013.01); *H01L 23/3738* (2013.01); *H01L 33/44* (2013.01); *H01L 33/641* (2013.01); *H01L 33/642* (2013.01); *Y10T 428/2495* (2015.01); *Y10T 428/24612* (2015.01); *Y10T 428/24802* (2015.01); *Y10T 428/24826* (2015.01); *Y10T 428/24942* (2015.01)

(56) References Cited

U.S. PATENT DOCUMENTS

| | | |
|---|---|---|
| 4,104,526 A | 8/1978 | Albert |
| 4,631,742 A | 12/1986 | Oliver |
| 4,685,118 A | 8/1987 | Furbee et al. |
| 4,866,749 A | 9/1989 | Uematu |
| 5,199,054 A | 3/1993 | Adams et al. |
| 5,812,632 A | 9/1998 | Schardt et al. |
| 6,011,356 A | 1/2000 | Janning et al. |
| 6,091,799 A | 7/2000 | Schmidt |
| 6,912,268 B2 | 6/2005 | Price et al. |
| 6,987,835 B2 | 1/2006 | Lovoi |
| 7,110,500 B2 | 9/2006 | Leek |
| 7,399,987 B1 | 7/2008 | Viscor et al. |
| 7,795,792 B2 | 9/2010 | Arnold et al. |
| 7,903,788 B2 | 3/2011 | Moore et al. |
| 8,320,521 B2 | 11/2012 | Zou et al. |
| 8,385,506 B2 | 2/2013 | Lemaitre et al. |
| 2007/0053495 A1 | 3/2007 | Morton et al. |
| 2007/0228922 A1 | 10/2007 | Nakasuji |
| 2008/0238289 A1* | 10/2008 | Zalyubovskiy et al. ...... 313/483 |
| 2010/0150315 A1 | 6/2010 | Filmer et al. |
| 2010/0284519 A1 | 11/2010 | Moore et al. |
| 2011/0142193 A1 | 6/2011 | Frontera et al. |
| 2011/0188637 A1* | 8/2011 | Lemaitre et al. ............ 378/136 |
| 2012/0045036 A1* | 2/2012 | Morton et al. ................ 378/113 |
| 2012/0217231 A1 | 8/2012 | Moore et al. |

\* cited by examiner

ELECTRON EMISSION SURFACE FOR X-RAY GENERATION

BACKGROUND

The subject matter disclosed herein relates to electron emission surfaces, such as for use in an electron gun.

In non-invasive imaging systems, X-ray tubes are used in various X-ray based imaging systems, such as radiography, mammography, tomosynthesis, C-arm angiography, fluoroscopy, and computed tomography (CT) systems, as well as others. In such systems, the X-ray tubes function as a source of X-ray radiation. The radiation is emitted in response to control signals during an examination or imaging sequence. Typically, the X-ray tube includes a cathode and an anode. An emitter within the cathode may emit a stream of electrons in response to heat resulting from an applied electrical current, and/or an electric field resulting from an applied voltage. The anode may include a target that is impacted by the stream of electrons. The target may, as a result of impact by the electron beam, produce X-ray radiation to be emitted toward an imaged volume.

In such imaging systems, the radiation passes through an imaging volume or space containing a subject of interest, such as a patient in a medical imaging context (but possibly a piece of baggage, a package, or an article of manufacture in non-medical contexts). A portion of the radiation impacts a digital detector or a photographic plate where the image data is collected. In digital X-ray systems a photodetector produces signals representative of the amount or intensity of radiation impacting discrete elements of a detector surface. The signals may then be processed to generate an image that may be displayed for review. In CT systems a detector array, including a series of detector elements, produces similar signals through various positions as a gantry is rotated about a patient.

In non-imaging systems where radiation may be employed, such as systems for oncological radiation treatment, a source of X-rays (such as an X-ray tube) may be used to direct ionizing radiation toward a target tissue. X-ray tubes used for radiation treatment purposes may also include a thermionic emitter and a target anode that generates X-rays, such as described above. Such X-ray tubes or sources may also include one or more collimation features for focusing or limiting emitted X-rays into a beam of a desired size or shape.

BRIEF DESCRIPTION

In one embodiment, an electron emitter is provided. The electron emitter includes a substrate having a first surface and a second surface opposite the first surface. The electron emitter also includes a first coating deposited on the first surface. The first coating has a lower work function than the substrate and the first coating has a different coefficient of thermal expansion than the substrate. The electron emitter also includes a second coating deposited on the second surface. The second coating also has a different coefficient of thermal expansion than the substrate.

In another embodiment, an electron emitter is provided. The electron emitter includes a substrate having a first surface and a second surface opposite the first surface. The electron emitter also includes a coating deposited on the first surface. The coating has a different coefficient of thermal expansion than the substrate. The electron emitter also includes one or more relief cuts extending at least partially through the coating and not extending entirely through the substrate.

In a further embodiment, an electron emitter is provided. The electron emitter includes a substrate having a first surface and a second surface opposite the first surface. The electron emitter also includes a first coating deposited on the first surface. The first coating has a lower work function than the substrate and the first coating has a different coefficient of thermal expansion than the substrate. The electron emitter also includes a second coating deposited on the second surface. The second coating also has a different coefficient of thermal expansion than the substrate. The electron emitter also includes one or more relief cuts extending at least partially through one of the first coating or the second coating and not extending entirely through the substrate.

In an additional embodiment, an X-ray tube is provided. The X-ray tube includes an electron beam source. The electron beam source includes an electron emitter configured to emit an electron beam. The electron emitter includes a substrate having a first surface and a second surface opposite the first surface. The electron emitter also includes a first coating deposited on the first surface. The first coating has a lower work function than the substrate and the first coating has a different coefficient of thermal expansion than the substrate. The electron emitter also includes a second coating deposited on the second surface. The second coating also has a different coefficient of thermal expansion than the substrate. The X-ray tube also includes an anode assembly configured to receive the electron beam and to emit X-rays when impacted by the electron beam. The X-ray tube further includes a housing in which the electron beam source and the anode assembly are disposed.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
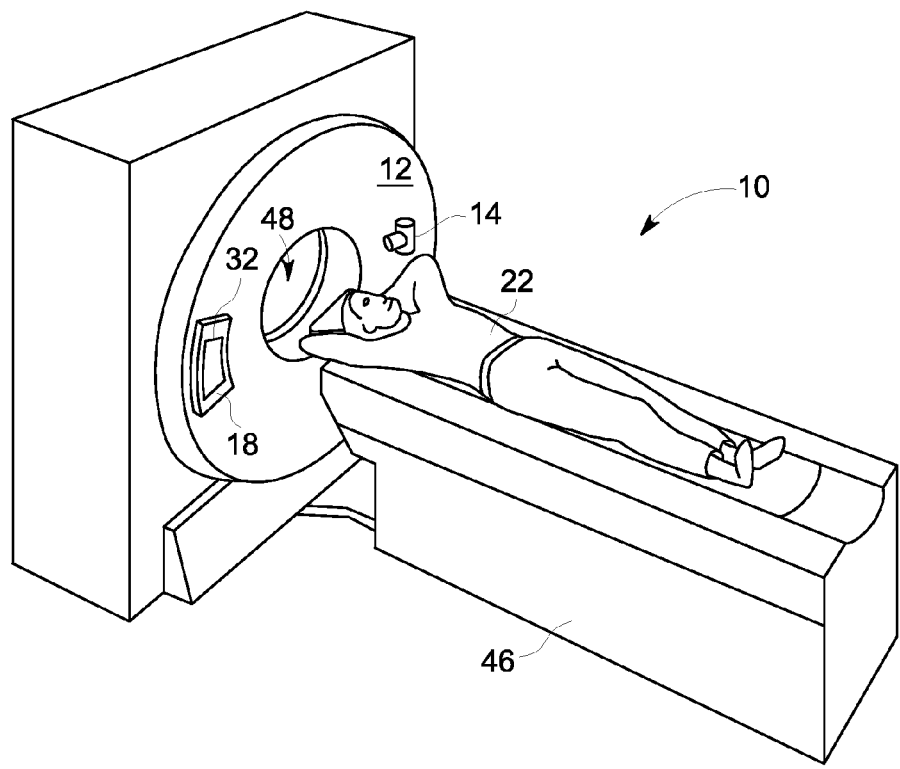
FIG. 1 is a pictorial view of a CT imaging system incorporating an embodiment of the present disclosure.

Electron emitters for use in conjunction with a cathode assembly of an X-ray tube are discussed herein. The electron emitters incorporate structural features that result in a generally flat or curved electron emission surface that may have a diameter of about 1 mm to about 15 mm. The electron emitters are capable of maintaining a relatively uniform temperature across the entire electron emission surface, which results in a robust focal spot for imaging purposes. Further, in certain embodiments, the emitted electron current is controlled independent of the X-ray tube voltage and both the X-ray tube voltage and emitted electron current are controlled at a microsecond time scale.

In certain embodiments the electron emitter may be formed as a coated substrate to maximize emitter life and improve performance. For example, a coating may be formed using materials such as hafnium carbide, tantalum carbide, hafnium diboride, zirconium carbide, hafnium nitride, tantalum nitride, zirconium nitride, tungsten diboride and their derivatives, and deposited on a substrate layer. The substrate layer may be manufactured using a material such as tungsten or tantalum.

One consequence of providing a substrate layer that is coated using a different material is that the respective substrate and coating materials may have different thermal expansion coefficients. As a result, the desired configuration of the electron emission surface may deflect or otherwise deform in response to thermal loading (e.g., heating) when in use. Such deflection or deformation may impair the ability of the electron optics to focus and steer the electron beam. Further, such distortion can affect the intensity distribution of the electron beam, which could lead to hot spots or melting on the target.

As discussed herein, various approaches may be employed to address these differences in thermal expansion coefficient between the coating and substrate layers. For example, in one implementation, the coating may be provided on opposing surfaces of the substrate layer. Alternatively, scoring (e.g. relief cuts or trenches) may be provided within the coating layer or coating and substrate layers to compensate for the differences in thermal expansion coefficients. In addition, in certain embodiments, the coating or coatings may be provided in a graded manner (i.e., having different thickness at different lateral locations) to control, eliminate, or reduce curvature in operation. Further, the emission surface may be configured such that a curvature resulting from the different thermal expansion coefficients produced the desired emission surface profile, such as a concave profile for focusing an electron beam on a target surface and/or for increasing emission current.

With the preceding in mind, and to facilitate explanation by providing a specific example, an operating environment is described herein corresponding to a computed tomography (CT) system. However, though described with respect to an embodiment of a CT scanner, the present approach is equally applicable to other X-ray based systems, including fluoroscopy, mammography, angiography, and standard radiographic imaging systems as well as radiation therapy treatment systems. Additionally, it will be appreciated by those skilled in the art that the disclosed embodiments are suitable for use with other applications in which an electron gun and/or electron emitter is implemented, whether for X-ray emission or otherwise.

With this in mind, FIG. 1 depicts a computed tomography (CT) imaging system 10 that includes a gantry 12. The gantry 12 has an X-ray source 14 that projects a beam of X-rays 16 toward a detector assembly on the opposite side of the gantry 12. A detector assembly 18 is formed by a plurality of detectors 20 and data acquisition system 32. The plurality of detectors 20 (see FIG. 2) sense the projected X-rays that pass through a patient 22, and the data acquisition system 32 converts the data to digital signals for subsequent processing. Each detector 20 produces an electrical signal that represents the intensity of an impinging X-ray beam and hence the attenuated beam as it passes through the patient 22. During a scan to acquire X-ray projection data, the gantry 12 and the components mounted thereon rotate about a center of rotation 24.

Figure 2:
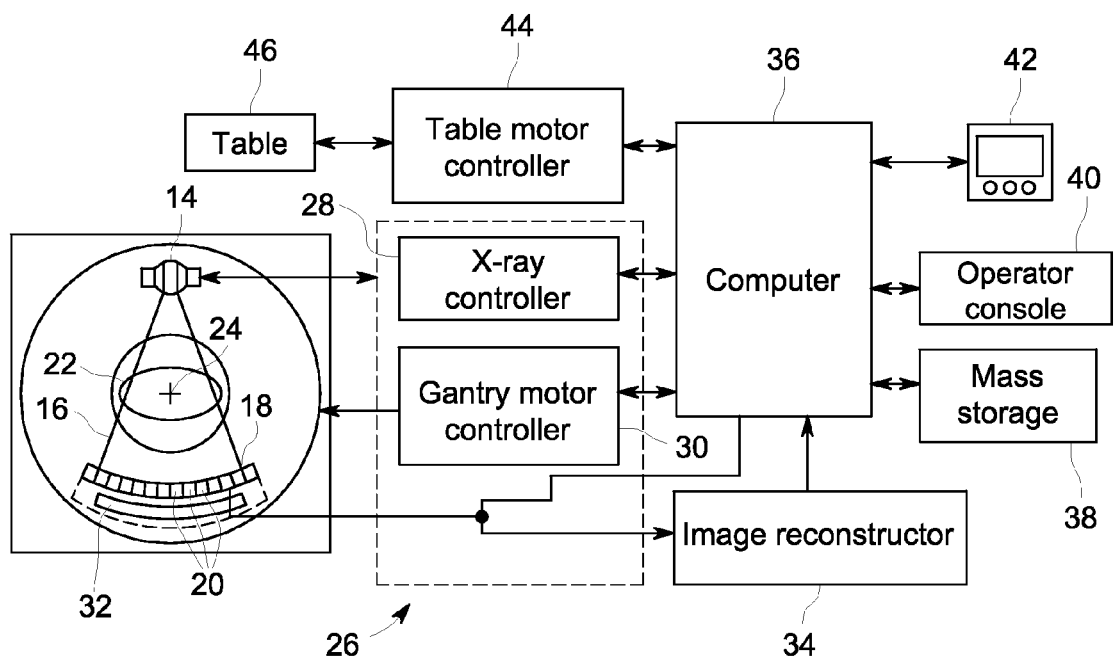
FIG. 2 is a block schematic diagram of the system illustrated in FIG. 1.

Referring to FIG. 2, rotation of the gantry 12 and the operation of X-ray source 14 are governed by a control mechanism 26 of CT system 10. The control mechanism 26 includes an X-ray controller 28 that provides power and timing signals to an X-ray source 14 and a gantry motor controller 30 that controls the rotational speed and position of gantry 12. An image reconstructor 34 (such as a processor-based image reconstruction component) receives sampled and digitized X-ray data from the data acquisition system 32 and performs high speed reconstruction. The reconstructed image may be communicated to a computer 36 that stores the image in a mass storage device 38 or displays the image for viewing.

The computer 36 also receives commands and scanning parameters from an operator via a console 40 that has some form of operator interface, such as a keyboard, mouse, voice activated controller, or any other suitable input apparatus. An associated display 42 allows the operator to observe the reconstructed image and other data from the computer 36. The operator-supplied commands and parameters are used by the computer 36 to provide control signals and information to the data acquisition system 32, the X-ray controller 28, and the gantry motor controller 30. In addition, the computer 36 operates a table motor controller 44 that controls a motorized table 46 to position the patient 22 with respect to the gantry 12. In particular, the table 46 moves the patient 22 through a gantry opening 48 of FIG. 1, either in whole or in part.

Figure 3:
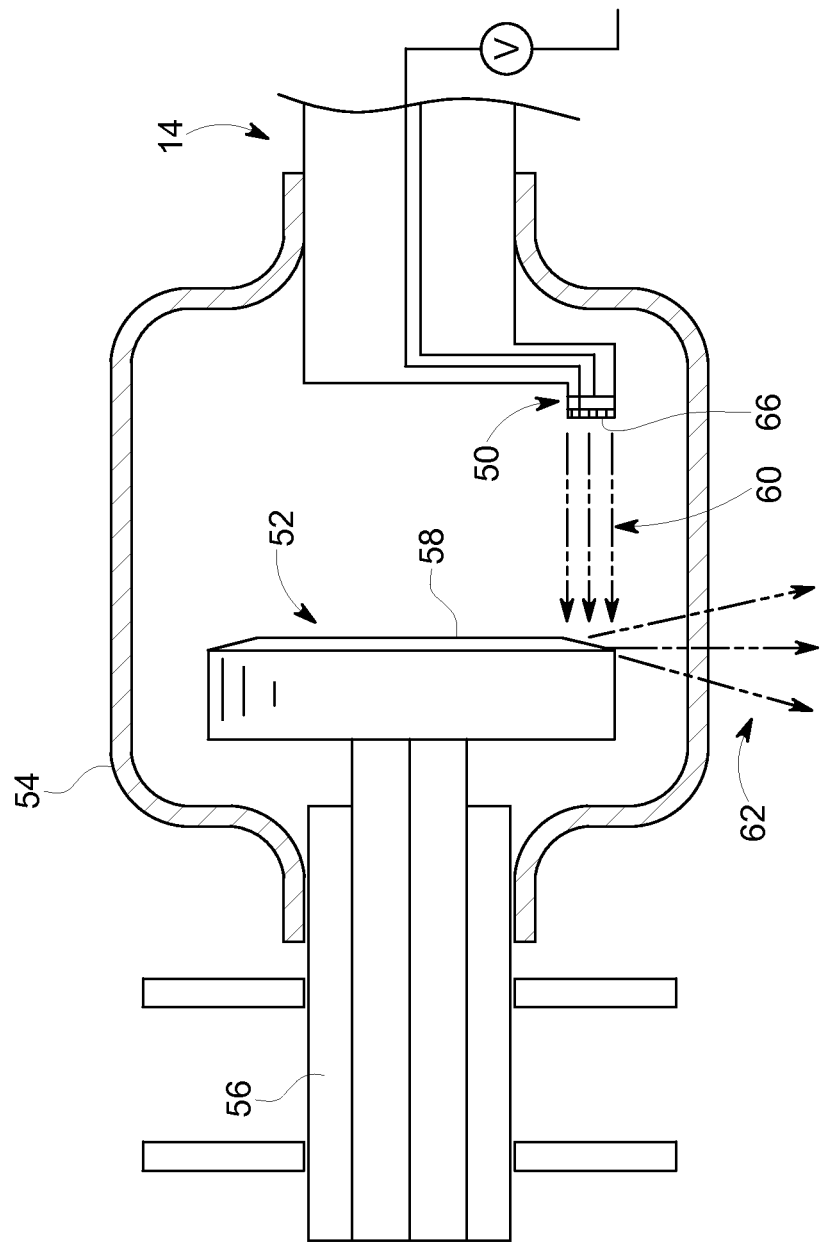
FIG. 3 is a schematic view of an X-ray source in accordance with an embodiment of the present disclosure.

Referring now to FIG. 3, the X-ray source 14 included in CT system 10 is shown in detail. The X-ray source 14 includes an X-ray generating tube, which includes an electron gun 50, which may be configured as a Pierce electron gun, and an anode assembly 52 encased in a housing 54. The anode assembly 52 includes a rotor 56 configured to turn a rotating anode disc 58 (i.e., target). When struck by an electron stream 60 emitted from the electron gun 50, the anode 58 emits an X-ray beam 62.

The X-ray tube is supported by the anode and cathode assemblies within a housing 54 defining an area of relatively low pressure (e.g., a vacuum). For example, the housing 54 may include glass, ceramics, or stainless steel, or other suitable materials. The anode 58 may be manufactured of any metal or composite, such as tungsten, molybdenum, copper, or any material that contributes to Bremsstrahlung radiation (i.e., deceleration radiation) when bombarded with electrons. The anode's surface material is typically selected to have a relatively high thermal diffusivity to withstand the heat generated by electrons impacting the anode 58. The space between the cathode assembly 66 and the anode 58 may be evacuated to minimize electron collisions with other atoms and to increase high voltage stability. Moreover, such evacuation may advantageously allow a magnetic flux to quickly interact with (i.e., steer or focus) the electron beam 60. In some X-ray tubes, electrostatic potential differences in excess of 20 kV are created between the cathode assembly 66 and the anode 58, causing electrons emitted by the cathode assembly 66 to accelerate towards the anode 58.

Figure 4:
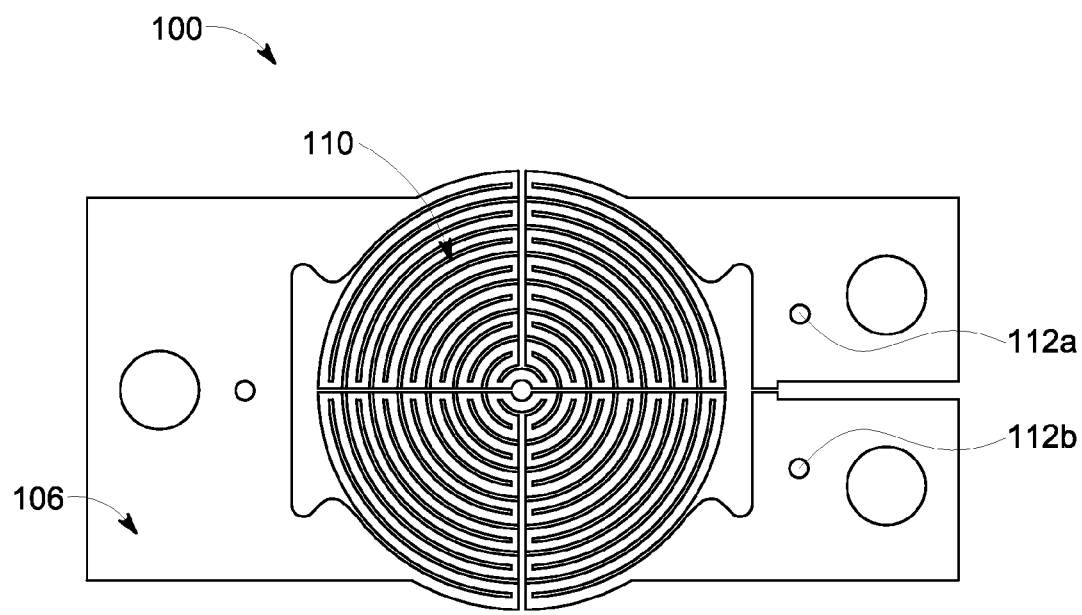
FIG. 4 is a top view of an emitter in accordance with an embodiment of the present disclosure.
Figure 5:
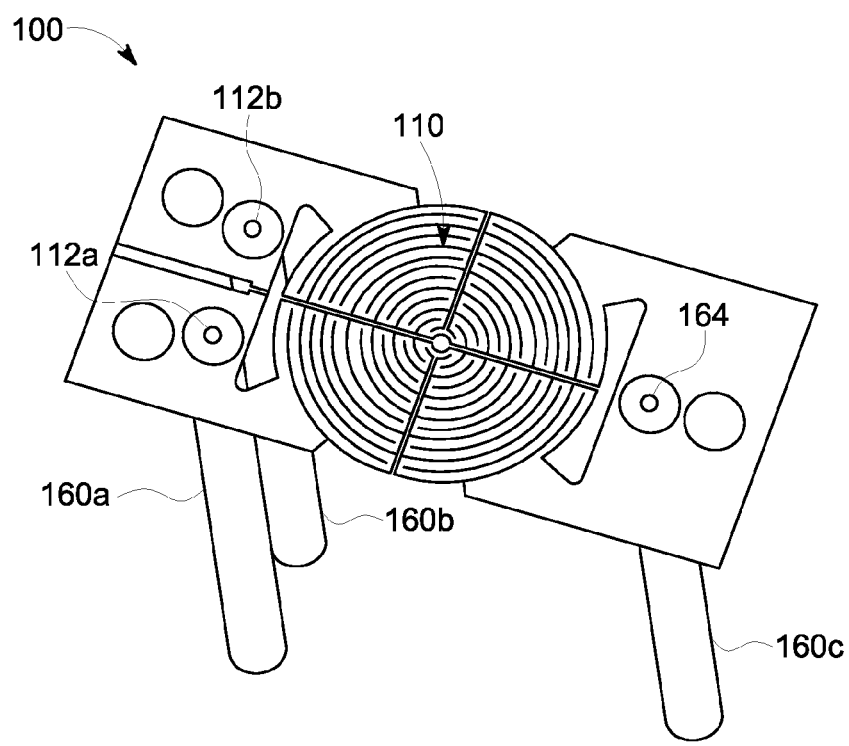
FIG. 5 is a perspective view of the emitter of FIG. 5 in accordance with an embodiment of the present disclosure.

Turning to FIGS. 4 and 5, these figures respectively depict a top view and perspective view of an embodiment of an emitter 100 that may be incorporated as part of the cathode assembly 66 for emission of electrons. The emitter 100 includes an anode-facing surface 106 on which an electron emission surface 110 is formed that emits electrons when heated. The effective electron emission surface, in certain embodiments, may have a diameter of 7 mm, 10 mm, or more generally, anywhere between about 6 mm and about 12 mm.

Although the emitter 100 is depicted as featuring a flat emission surface, it should be understood that the emitter, in certain embodiments, may be curved (outward or inward) or otherwise nonplanar. Joule heating increases the temperature of the emitter 100 when voltage is applied across the emission surface 110 causing current (i.e., a driving current) to flow through a current path defined by the emitter surface, here depicted as a serpentine radial path through four quadrants. The flow of electricity through the serpentine path results in the heating of the emission surface 110 and eventual electron emission when the emitter 100 reaches sufficiently high temperatures.

As depicted in FIG. 5, two or more posts 160 may be provided to hold the emission surface in position and to provide a current path to the emission surface. For example, in one embodiment, the post 160a is electrically coupled to the terminal 112a and provides electrical current. Similarly, the post 160b is coupled to the terminal 112b. In this example, the post 160c is not electrically conductive and is coupled to the emitter 100 at junction 164. This coupling, whether fixed or sliding, provides structural support to hold the emitter in-plane. It should be understood that the positions of the posts 160 and the terminals 112 may be exchanged. Further, the emitter 110 may be configured with a two-post arrangement rather than a three-post arrangement. In the two post arrangement, again, one of the couplings between emitter and post can be sliding as long as electrical contact is maintained. The posts may be affixed in any suitable manner to the emitter 100. In one embodiment, the posts 160 are laser welded to the emitter 100. In one embodiment, the posts 160 are coupled to the emitter 100 at positions outside of the emission surface 110.

As discussed herein, the emitter 100 may be constructed as a multi-layer structure, with a substrate layer, such as a tungsten layer, coated by a coating material, such as hafnium carbide (HfC). In one embodiment, a coating may be selected that has a lower work function than that of the substrate. That is, the coating may require less thermal energy to release electrons than the thermal energy required of the substrate and, thus, the coating may form the electron emission surface 110 mentioned above. The flow of electricity through the electron emitter results in the heating of the coated emission surface and eventual electron emission when the coating reaches sufficiently high temperatures. The emitter 100 is capable of achieving emission temperatures with relatively larger emission surface diameters (e.g., at least 7 mm) with drive currents of about 7 Amps to about 9.5 Amps. This arrangement provides scaling up of emission surface diameter and improved electron emission characteristics without undesirable scaling up of the associated drive current. In one embodiment, the emission surface 110 may be any suitable shape or configuration that achieves this effect. For example, the emission surface 110 may be generally round, disc-shaped, circular, annular, elliptical, or rectangular.

In certain implementations, the emitter 100 may be fabricated by initially depositing a layer of a coating material, as discussed herein, on one or both faces of a substrate layer. To form an electron emission surface 110 as shown in FIGS. 4 and 5, the coated substrate material may undergo a patterning process, such as to remove coating material from those regions where it is not desired (e.g., regions other than the emission surface) followed by a cutting process by which the circuit pathway, (e.g., the serpentine, quadrant path shown in FIGS. 4 and 5) is formed.

In emitter embodiments where the coating has a work function of approximately 3.5 electron volts (eV), the emitted electron current density (i.e., a measure related to the number and density of electrons emitted per surface area of the filament) may improve by a factor of approximately one hundred when compared to a traditional uncoated tungsten filament at the same temperature. Accordingly, the coated surface may produce significantly more electrons and a more powerful electron beam 60 when compared to the electron beam produced by a traditional filament at the same temperature. Additionally, the coating may be selected to be resistant to certain gases that may be present in the X-ray tube assembly as well as to back-bombardment of ions (e.g., rebounding electrons), resulting in a coating that has a long operational life.

In operation, the emitter 100 may be heated from approximately room temperature (e.g., 25° C. or 26° C.) to an operating or emission temperature of over 2,000° C. (e.g., 2,100° C., 2,200° C. or more). That is, to the extent that the coating material and coated substrate have different coefficients of thermal expansion the mismatch in thermal expansion in response to heat may lead to the coated substrate bowing outward or inward. Thus, an emitter formed using two layers of different materials that are matched in terms of the mechanical properties of the respective materials may still be mismatched with respect to the thermomechanical properties of the two materials, which may lead to deflection or bowing of the emitter in response to temperature changes, such as when heated.

By way of example, an uncoated, tungsten emitter of the type shown in FIGS. 4 and 5 and having a thickness of 200 µm has been observed in simulation to have an off-plane displacement (i.e., $\Delta Z$) of approximately 2 µm at 2,677° C. That is, the single material layer (i.e., uncoated substrate) exhibits a low degree of deflection in the form of off-plane displacement when heated and this small deflection may be due to the rigid coupling at the support posts that don't accommodate any growth of the emitter due to thermal expansion. Conversely, an emitter as shown in FIGS. 4 and 5 having a tungsten substrate of approximately 200 µm thickness and coated with a layer of hafnium carbide 20 µm thick on only the electron emitting surface has been observed in simulation to have an off-plane displacement ($\Delta Z$) of approximately 60µ at 2,200° C., forming a generally convex surface with respect to the planar emission surface exhibited when not heated. That is, the emitting surfaces bow or deflect outward toward the anode by the observed $\Delta Z$ when heated. In both studies, the diameter of the emission surface of the emitter 100 was 10 mm.

In one implementation, to address this deflection, the thickness of the substrate layer (e.g., the tungsten layer in this example) may be increased such as doubled. In one such study, it was observed that an emitter as shown in FIGS. 4 and 5 having a tungsten substrate of approximately 400 μm thickness, and emission surface diameter of 10 mm, and coated with a layer of hafnium carbide 20 μm thick on only the electron emitting surface had an off-plane displacement ($\Delta Z$) of approximately 45 μm at 2,200° C., corresponding to a decrease in deflection of 24%.

Figure 6:
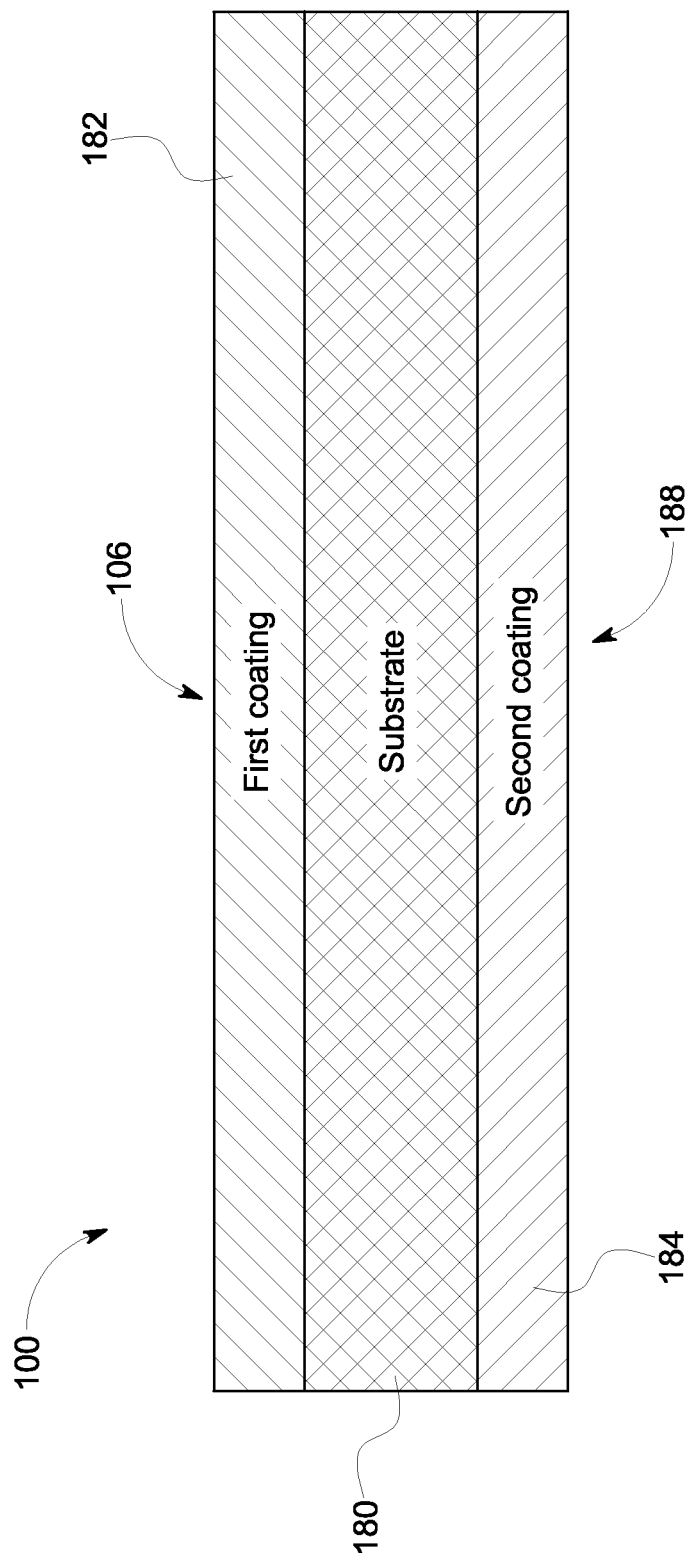
FIG. 6 is a sectional view of an emitter coated on two surfaces in accordance with an embodiment of the present disclosure.

Alternatively, in other embodiments a third layer may be provided on the non-anode facing surface (i.e., the non-emitting surface) of the emitter 100 to prevent or control curvature or deflection of the emitter surface during operation. For example, turning to FIG. 6, a cross section of a portion of an emitter 100 is shown having a base substrate 180, on which a first coating 182 is deposited on an anode facing surface 106 of the emitter 100 and a second coating 184 is deposited on an opposite surface 188 of the substrate 180. In one implementation, at least the first coating 182 (on the anode-facing surface 106 has a lower work function than the substrate 180, though both coatings 182, 184 may have the same work function or a lower work function than the substrate 180.

In one embodiment, the first coating 182 and the second coating 184 are of the same composition (e.g., both hafnium carbide), though in other embodiments this may not be the case and, instead the first and second coatings may be different materials having comparable thermomechanical properties. Similarly, in one embodiment, the first coating 182 and the second coating 184 are of the same thickness (e.g., both 20 μm in thickness).

In an embodiment where the first coating 182 and the second coating 184 are of the same composition (or of compositions having comparable or similar thermomechanical properties, such as thermal coefficients of expansion) and the same thickness, the emitter surface may remain substantially flat when heated or cooled due to the opposing tensions provided by the coatings. For example, in one study it was observed that an emitter 100 as shown in FIGS. 4 and 5 having a tungsten substrate 180 of approximately 200 μm thickness, an emission surface diameter of 10 mm, a first coating 182 of 20 μm thick hafnium carbide on the anode facing surface 106, and a second coating 184 of 20 μm thick hafnium carbide on the opposite surface 188 had an off-plane displacement ($\Delta Z$) of approximately 1.6 μm at 2,200° C.

Conversely, if some degree of curvature or deflection of the emitter surface is acceptable or desirable when in use, the first and second coating 182, 184 may have compositions selected to achieve the desired deflection and/or may have different thicknesses such that the desired curvature is obtained during operation of the emitter 100. Such curvature may be desired, in some instances, to improve emission current entitlement and/or focusing or concentration of the electron beam on the target. For example, in one study where hafnium carbide was employed for both the first coating 182 and the second coating 184, different thicknesses of the second coating 184 were simulated in conjunction with a 25 μm first coating 182 and a 200 μm substrate 180, yielding the following results:

TABLE 1

| First Coating Thickness (μm) | Second Coating Thickness (μm) | Max Deflection (μm) |
|---|---|---|
| 25 | 5 | 1211.1 |
| 25 | 10 | 851.7 |
| 25 | 15 | 533.2 |
| 25 | 20 | 250.8 |
| 25 | 25 | 0.5 |

As may be appreciated, by varying thicknesses in this manner, different curvatures of the emitter emission surface may be achieved in operation. For example, in certain implementations, it may be desirable for the emission surface to have a concave curvature or deflection during operation (i.e., where the center of the emitter is further from the anode than the edges). This may be achieved by having different thicknesses of the first and second coatings 182, 184 and/or different compositions of the first and second coatings 182, 184, as discussed herein.

Figure 7:
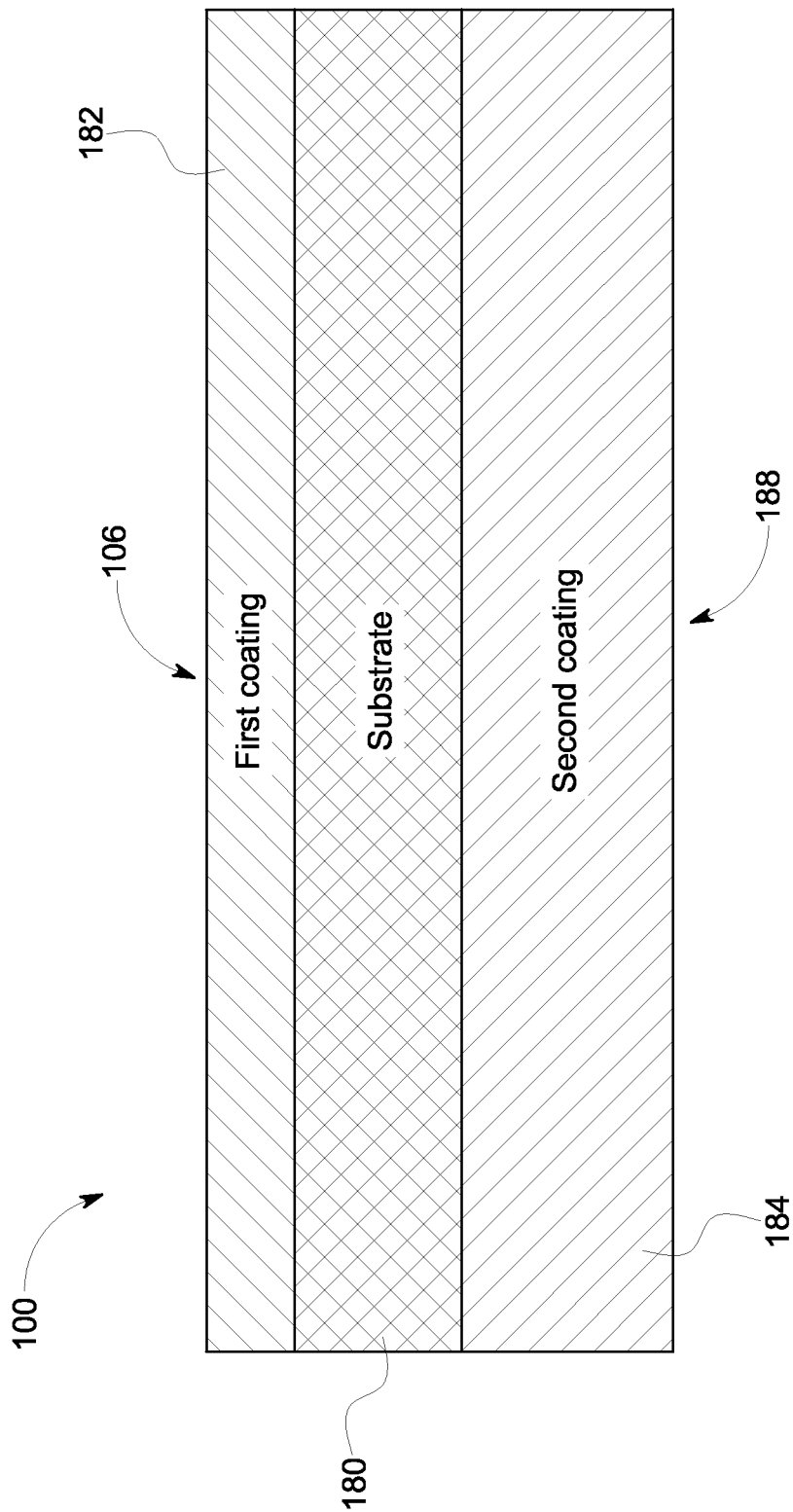
FIG. 7 is a sectional view of an emitter coated on two surfaces in accordance with another embodiment of the present disclosure.

Turning to FIG. 7, an implementation is depicted in which the first coating 182 and second coating 184 differ in one or both of composition or thickness. For example, in one such implementation, the first coating 182 may be a low work function material, such as hafnium carbide. However, the second coating 184 may be formed using a material providing different characteristics, such as a low emissivity coating for minimizing radiative heat loss. Examples of suitable materials for the second coating 184 in such an embodiment include, but are not limited to tantalum. More generally, in such an implementation, the second coating 184 may be any suitable high temperature material with lower emissivity than the substrate material at operating temperatures (e.g., 2,000° C.). In the depicted example, the thickness of the first coating 182 and second coating 184 may differ to account for differences in the thermal expansion coefficients of the materials used to form the first coating 182 and second coating 184. That is, the thicknesses of the coatings 182 and 194 may be determined to eliminate or minimize deflection of the emitter emission surface during operation or to achieve the desired degree of curvature of the electron emission surface.

While providing a second coating 184 on the non-emitting surface 188 is one approach for limiting or controlling deflection of the coated emitter, other approaches are also available. For example, turning to FIGS. 8-10 a variety of alternative approaches are depicted. In these examples, an emitter substrate 180 is depicted along with a coating 182 (e.g., a low work function coating, such as a hafnium carbide coating) along the electron emitting surface 106 of the emitter 100. Dimensions of the substrate 180 and coating 182 may generally correspond to the examples provided herein. For example, in one implementation the substrate 180 may be approximately 200 μm in thickness and the coating 182 may be between about 10 μm and about 100 μm in thickness, such as about 20 μm in thickness.

Figure 8:
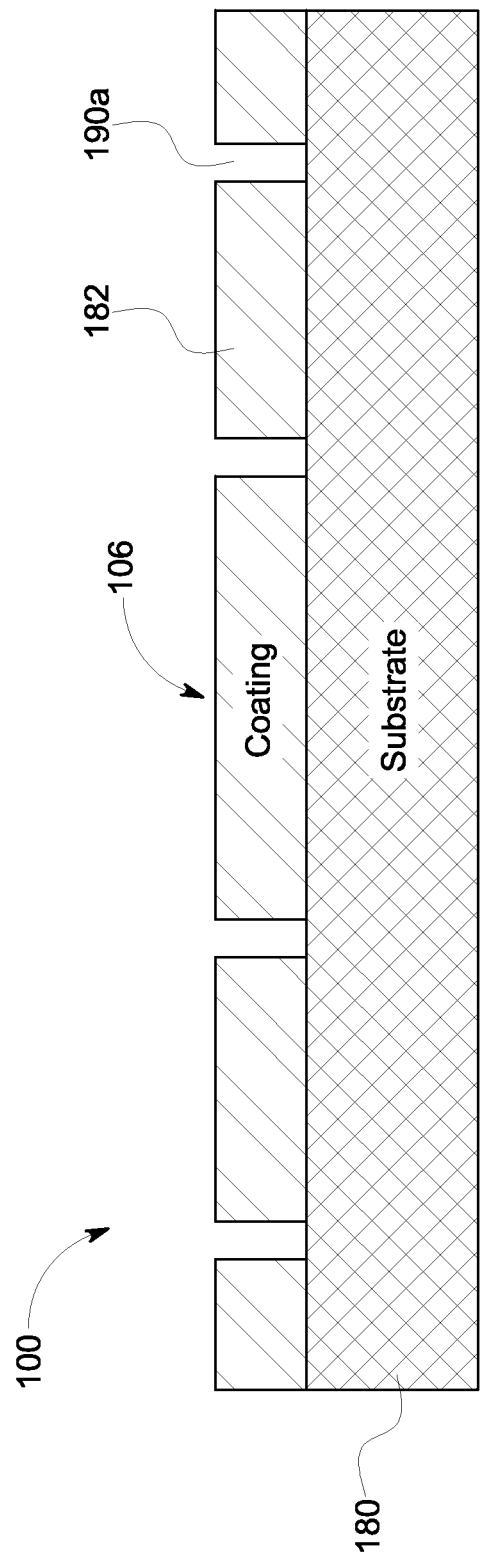
FIG. 8 is a sectional view of an emitter coated on a first surface and having relief cuts in accordance with an embodiment of the present disclosure.
Figure 9:
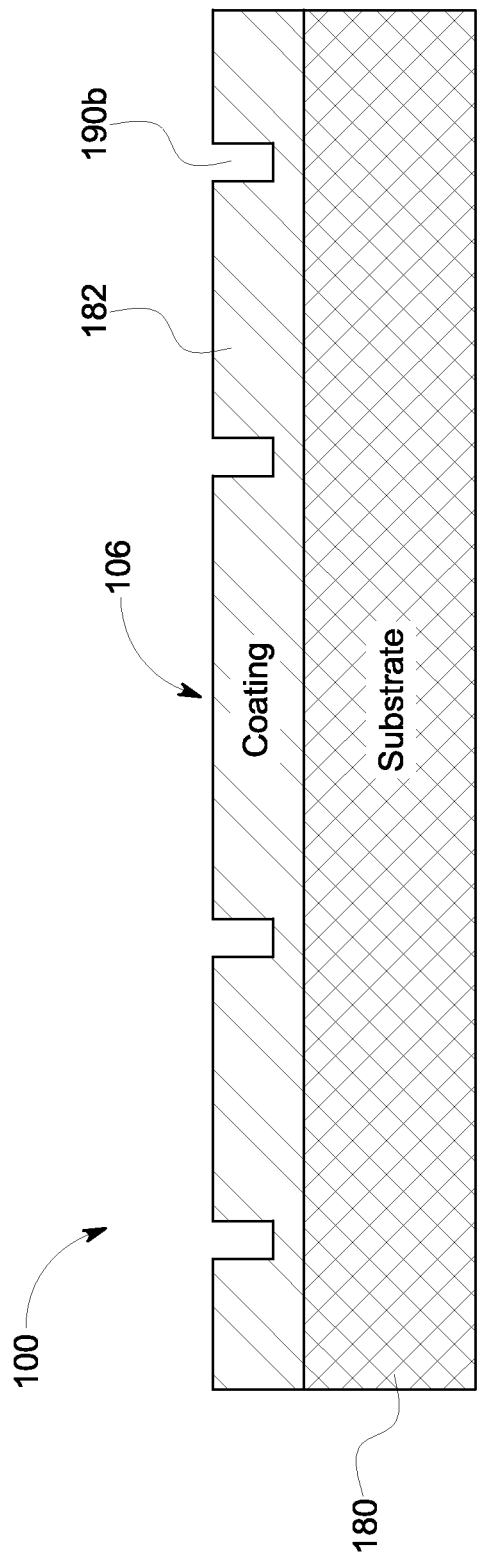
FIG. 9 is a sectional view of an emitter coated on a first surface and having relief cuts in accordance with another embodiment of the present disclosure.
Figure 10:
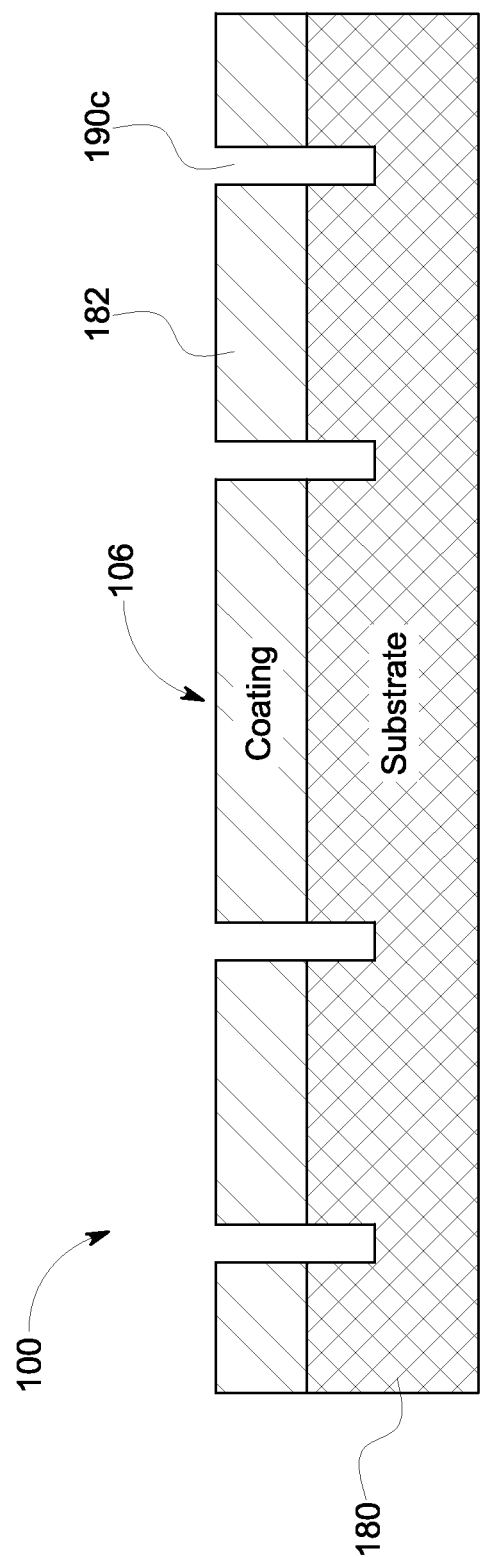
FIG. 10 is a sectional view of an emitter coated on a first surface and having relief cuts in accordance with a further embodiment of the present disclosure.

To address differences in thermomechanical properties (e.g., coefficients of thermal expansion) between the substrate material 180 and the coating material 182, the coating material 182 may be scored at various locations, as indicated at relief cuts (e.g., trenches) 190 of FIGS. 8-10, during the manufacturing process. In such embodiments, the relief cuts 190 act as expansion joints that address the differential expansion of one layer (e.g., the coating 182) relative to the other (e.g., the substrate 180), thereby allowing the emission surface of the emitter 100 to be maintained in a flat, non-deflected state during operation or, alternatively, to control the degree of deflection if some degree of curvature for the emission surface is desired.

In the depicted example of FIG. 8, the relief cuts 190a extend completely through the coating 182, but not through the substrate 180 to any appreciable degree. Alternatively, as depicted in FIG. 9, the relief cuts 190b may extend only partially through the coating 182 without reaching the substrate 180. Lastly, in a further embodiment depicted in FIG. 10, the relief cuts 190c may extend completely through the coating 182 and partially through the substrate 180. As will be appreciated, the different depths of the relief cuts 190 may allow for elimination or limitation of deflection of the electron emission surface during use or may allow for a desired degree of curvature of the emission surface to be achieved during use.

Figure 11:
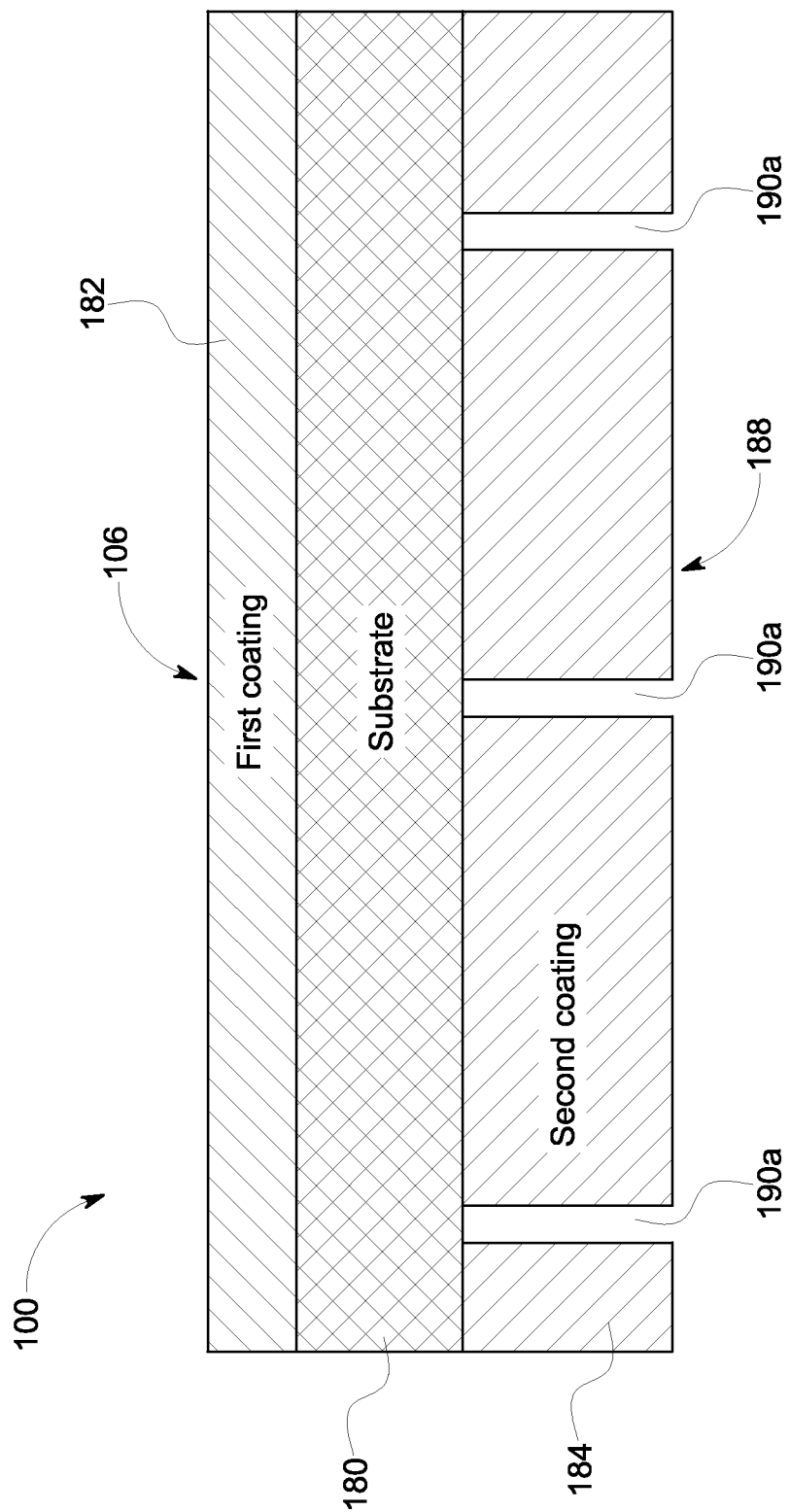
FIG. 11 is a sectional view of an emitter coated on a first and second surface and having relief cuts in the second surface, in accordance with an embodiment of the present disclosure.
Figure 12:
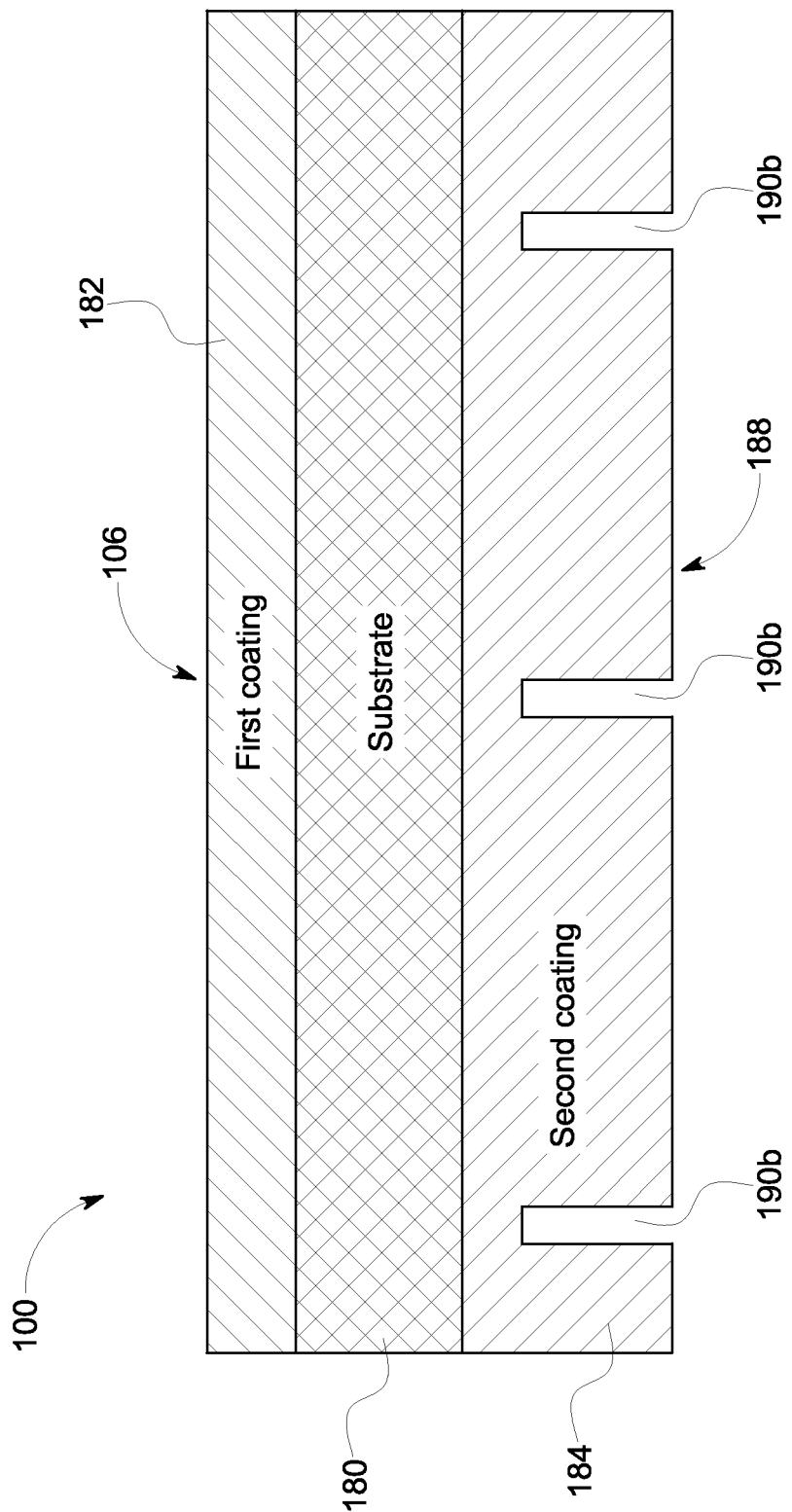
FIG. 12 is a sectional view of an emitter coated on a first and second surface and having relief cuts in the second surface, in accordance with an additional embodiment of the present disclosure.
Figure 13:
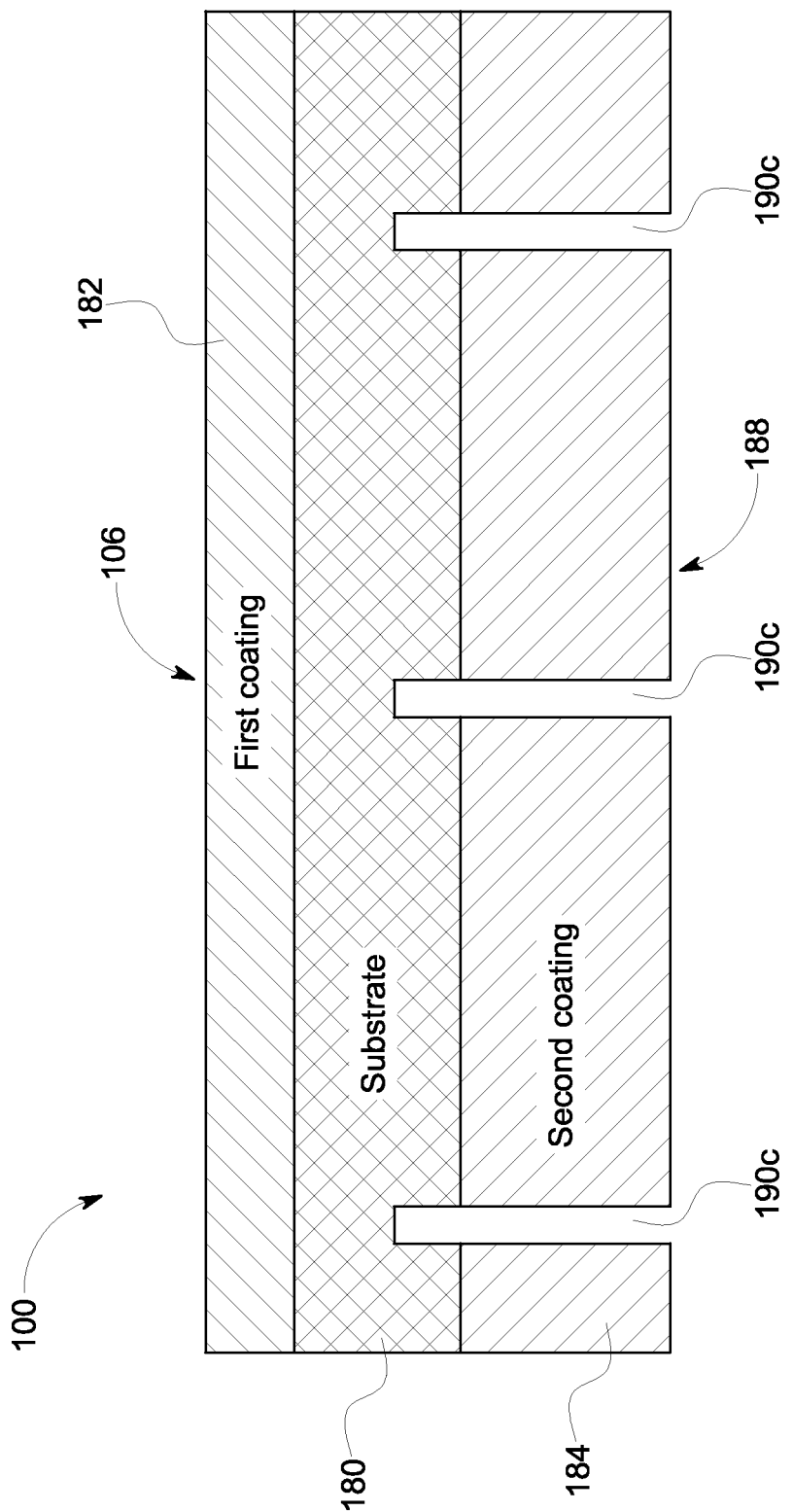
FIG. 13 is a sectional view of an emitter coated on a first and second surface and having relief cuts in the second surface, in accordance with a further embodiment of the present disclosure.

Turning to FIGS. 11-13, an additional set of implementations are shown in which the second coating 184 is present on the non-electron emitting surface 188 of the emitter 100. In this example, the relief cuts 190 are made through the second coating 184 instead of through the first coating 182. As with the relief cuts 190 though the first coating 182, relief cuts 190 made through the second coating 184 may also be made at different depths to accommodate different degrees of thermal expansion during operation of the emitter 100. For example, the relief cuts may be made completely though the second coating 184 but not appreciably into the substrate 180 (i.e., relief cuts 190a), as shown in FIG. 11. Alternatively, relief cuts may be made partially through the second coating 184 (i.e., relief cuts 190b), as shown in FIG. 12. Similarly, relief cuts may be made completely through the second coating 184 and partially through the substrate 180 (i.e., relief cuts 190c), as shown in FIG. 13. As will be appreciated, the different depths of the relief cuts 190 may allow for elimination or limitation of deflection of the electron emission surface during use or may allow for a desired degree of curvature of the emission surface to be achieved during use. Further, in such embodiments, the first coating 182 and second coating 184 may or may not be formed of the same materials or at the same thicknesses.

In certain embodiments, the cuts 190, whether through the first coating 182 or second coating 184, may be formed as part of the manufacturing process. For example, in one embodiment, the emitter may be formed by performing an initial deposition of the coating(s) 180, 182, on the substrate 180, followed by a patterning process to remove excess coating followed by a cutting process, such as a laser cutting process whereby the circuit path (e.g., a serpentine, quadrant path) is cut into the coated substrate. As part of this laser cutting process, or in addition to this process, in addition to the cutting of the circuit pattern or path through the coated substrate, the relief cuts 190 may also be cut into, but not through, portions of the coated substrate to form the emitter 100.

Technical effects of the invention include, but are not limited to, the inclusion of layers or surface features on an electron emitting structure to control or limit deflection of the electron emitting structure during operation, e.g., at operating temperatures.

This written description uses examples, including the best mode, and also to enable any person skilled in the art to practice the techniques, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An electron emitter comprising:
   a substrate having a first surface and a second surface opposite the first surface;
   a first coating deposited on the first surface, wherein the first coating has a lower work function than the substrate, wherein the first coating emits electrons when heated to an operating temperature of 2000° C. or greater, and wherein the first coating has a different coefficient of thermal expansion than the substrate; and
   a second coating deposited on the second surface, wherein the second coating also has a different coefficient of thermal expansion than the substrate;
   wherein expansion of the first coating and the second coating at the operating temperature of the electron emitter offset one another to substantially eliminate deflection of the electron emitter or to deflect the electron emitter to a controlled extent.

2. The electron emitter of claim 1, further comprising at least two posts coupled to the substrate that physically secure the electron emitter and provide current to the electron emitter.

3. The electron emitter of claim 1, wherein the first coating and the second coating have the same composition, the same thickness, and the same coefficient of thermal expansion.

4. The electron emitter of claim 1, wherein the first coating and the second coating both comprise hafnium carbide.

5. The electron emitter of claim 1, wherein the second coating has lower emissivity than the substrate during operation.

6. The electron emitter of claim 1, wherein the first coating and the second coating differ in composition.

7. The electron emitter of claim 6, wherein the differing compositions of the first coating and the second coating are selected so as to achieve a desired curvature of the electron emitter at the operating temperature of the electron emitter.

8. The electron emitter of claim 1, wherein the first coating and the second coating differ in thickness.

9. The electron emitter of claim 8, wherein the differing thicknesses of the first coating and the second coating are selected so as to achieve a desired curvature of the electron emitter at the operating temperature of the electron emitter.

10. An electron emitter comprising:
    a substrate having a first surface and a second surface opposite the first surface;
    a coating deposited on the first surface, wherein the coating has a different coefficient of thermal expansion than the substrate; and
    one or more relief cuts extending at least partially through the coating and not extending entirely through the substrate.

11. The electron emitter of claim 10, wherein the coating has a lower work function than the substrate.

12. The electron emitter of claim 10, wherein the relief cuts extend only partially through the coating.

13. The electron emitter of claim 10, wherein the relief cuts extend through the coating but do not extend substantially into the substrate.

14. The electron emitter of claim 10, wherein the relief cuts extend through the coating and partially through the substrate.

15. The electron emitter of claim 10, wherein coating comprises hafnium carbide.

16. An electron emitter comprising:
a substrate having a first surface and a second surface opposite the first surface; a first coating deposited on the first surface, wherein the first coating has a lower work function than the substrate and wherein the first coating has a different coefficient of thermal expansion than the substrate;
a second coating deposited on the second surface, wherein the second coating also has a different coefficient of thermal expansion than the substrate; and
one or more relief cuts extending at least partially through one of the first coating or the second coating and not extending entirely through the substrate.

17. The electron emitter of claim 16, wherein the relief cuts extend only partially through the first coating or the second coating.

18. The electron emitter of claim 16, wherein the relief cuts extend through the first coating or the second coating but do not extend substantially into the substrate.

19. The electron emitter of claim 16, wherein the relief cuts extend through the first coating or the second coating and partially through the substrate.

20. An X-ray tube comprising:
an electron beam source comprising an electron emitter configured to emit an electron beam, wherein the electron emitter comprises:
a substrate having a first surface and a second surface opposite the first surface;
a first coating deposited on the first surface, wherein the first coating has a lower work function than the substrate and wherein the first coating emits electrons when heated to an operating temperature of 2000° C. or greater, and wherein the first coating has a different coefficient of thermal expansion than the substrate; and
a second coating deposited on the second surface, wherein the second coating also has a different coefficient of thermal expansion than the substrate and wherein the second coating has lower emissivity than the substrate during operation;
an anode assembly configured to receive the electron beam and to emit X-rays when impacted by the electron beam; and
a housing in which the electron beam source and the anode assembly are disposed.

* * * * *